(12) United States Patent
Kleinwächter

(10) Patent No.: US 7,227,077 B2
(45) Date of Patent: Jun. 5, 2007

(54) LIGHT ELEMENT WITH A TRANSLUCENT SURFACE

(75) Inventor: Jürgen Kleinwächter, Lörrach (DE)

(73) Assignee: PowerPulse Holding AG, Zug (CH)

( * ) Notice: Subject to any disclaimer, the term of this patent is extended or adjusted under 35 U.S.C. 154(b) by 0 days.

(21) Appl. No.: 09/827,250

(22) Filed: Apr. 5, 2001

(65) Prior Publication Data

US 2001/0054252 A1    Dec. 27, 2001

Related U.S. Application Data

(63) Continuation of application No. PCT/DE99/03164, filed on Oct. 1, 1999.

(30) Foreign Application Priority Data

Oct. 5, 1998   (DE)   ............................... 198 45 656

(51) Int. Cl.
  *H01L 31/058*   (2006.01)
(52) U.S. Cl. .................. 136/248; 136/259; 126/600; 126/621; 126/698; 126/700; 47/17; 359/591; 359/593
(58) Field of Classification Search ............... 136/246, 136/259, 291, 248; 126/621, 600, 628, 698, 126/700; 47/17; 359/591, 593, 742; 250/203.4
See application file for complete search history.

(56) References Cited

U.S. PATENT DOCUMENTS

| | | | | |
|---|---|---|---|---|
| 3,125,091 A | * | 3/1964 | Sleeper, Jr. | 126/624 |
| 4,051,834 A | * | 10/1977 | Fletcher et al. | 126/625 |
| 4,057,048 A | * | 11/1977 | Maine | 126/648 |
| 4,191,594 A | * | 3/1980 | Stark et al. | 136/246 |
| 4,280,853 A | * | 7/1981 | Palazzetti et al. | 136/246 |
| 4,290,416 A | * | 9/1981 | Maloney | 126/618 |
| 4,312,709 A | * | 1/1982 | Stark et al. | 202/83 |
| 4,313,650 A | * | 2/1982 | Ward et al. | 359/596 |
| 4,326,012 A | | 4/1982 | Charlton | |
| 4,341,201 A | * | 7/1982 | Ziemann | 126/585 |
| 4,389,085 A | * | 6/1983 | Mori | 359/591 |
| 4,421,097 A | | 12/1983 | Meckler | |
| 4,459,970 A | * | 7/1984 | Clee | 126/563 |
| 4,485,804 A | * | 12/1984 | Sharpe | 126/625 |
| 4,552,126 A | * | 11/1985 | Boyd | 126/680 |
| 4,723,826 A | | 2/1988 | Whitaker | |
| 4,765,726 A | * | 8/1988 | Johnson | 359/742 |
| 4,805,984 A | * | 2/1989 | Cobb, Jr. | 385/133 |
| 4,832,755 A | * | 5/1989 | Barton et al. | 136/251 |
| 4,874,225 A | * | 10/1989 | Pruszenski, Jr. | 359/592 |

(Continued)

FOREIGN PATENT DOCUMENTS

CH    591090   *   9/1977

(Continued)

Primary Examiner—Nam Nguyen
Assistant Examiner—Anthony Fick
(74) Attorney, Agent, or Firm—Henry M. Feiereisen; Ursula B. Day

(57) ABSTRACT

A light element with a translucent surface includes an energy converter, wherein the translucent surface is so formed as to direct only that portion of the radiation onto the energy converter that impinges on the translucent surface. The energy converter may be a solar cell, a fluid line or a light guide. The light element is particularly suited for illuminating interior spaces with diffuse light.

13 Claims, 4 Drawing Sheets

U.S. PATENT DOCUMENTS 5,089,055 A * 2/1992 Nakamura .................. 136/248
5,204,777 A    4/1993 Curshod
6,111,190 A * 8/2000 O'Neill ...................... 136/246
6,407,328 B2 * 6/2002 Kleinwachter .............. 136/246

FOREIGN PATENT DOCUMENTS

| DE | 196 14 787 A | 10/1997 |
| DE | 19614787 A1 * | 10/1997 |
| FR | 2 552 211 A | 3/1985 |
| FR | 2552211 * | 3/1985 |
| GB | 1550488 * | 8/1979 |

* cited by examiner

LIGHT ELEMENT WITH A TRANSLUCENT SURFACE

CROSS-REFERENCES TO RELATED APPLICATIONS

This application is a continuation of prior filed copending PCT International application no. PCT/DE99/03164, filed Oct. 1, 1999.

This application claims the priority of German Patent Application Serial No. 198 45 656.5, filed Oct. 5, 1998, the subject matter of which is incorporated herein by reference.

BACKGROUND OF THE INVENTION

The invention relates to light element with a translucent surface, and more particularly, to a light element that efficiently extract the direct as well as the diffuse portion of the optical radiation impinging on the translucent surface.

Sunlight shining through windows, glass walls and roofs can be used to illuminate the interior of a room. However, a strong light intensity can oftentimes cause glare, an inhomogeneous light distribution as well as a severe temperature increases in the interior space. Conversely, blinds can block the light flux from reaching the building interior so that artificial lighting has to be provided. The light reaching the interior space consists of sunlight, which enter directly from the outside areas, and uniformly distributed diffuse light that is hemispheric, i.e. radiated from all directions into the half space. The intensity of the diffuse light can reach up to 10% of the direct light depending on the atmospheric conditions.

Because of the need to provide shade, a major portion of the electric power in many high-rise buildings is consumed during the day as a consequence of the energy consumed by lamps and light fixtures installed in the interior spaces. Artificial light sources can be characterized as "heating elements with a weak illumination effect," requiring additional electrical energy for air conditioning to remove the generated heat from the interior space.

Several types of blinds have been developed over the years wherein their relative orientation relative to the sun can be controlled so that the blinds are either transparent or reflecting. These blinds can reflect the unwanted direct light from the outside and only let the diffuse light pass. For example, blinds can be made of rotatable prisms. The transparent prism systems reflect the direct sunlight and let the diffuse light pass if they are oriented perpendicular to the sun rays, thereby forming selectively transparent blinds.

These conventional systems can improve the illumination of interior spaces with windows, glass facades or glass roofs. However, the masked-off direct sunlight—although valuable as an energy source—is disadvantageously returned to the outside through reflection.

It would therefore be desirable and advantageous to provide an improved light element that obviates prior art shortcomings and that can efficiently utilize the radiation directly impinging on the translucent surface.

SUMMARY OF THE INVENTION

According to one aspect of the invention, a light element with a translucent surface includes an energy conduit, wherein the translucent surface is so formed that only the radiation that directly strikes the translucent surface is directed onto the energy conduit.

Accordingly, the major portion of the direct portion of the optical radiation received by the optical element of the invention is directed onto the energy conduit in order to utilize the energy, whereas the diffuse portion of the optical radiation bypasses the energy conduit and can be used for illumination purposes. The energy conduit can be, for example, an energy converter or light guide.

The global sunlight is thus processed selectively in that the diffuse portion is transmitted and hence provides basic illumination for an interior space, whereas the direct portion of the sunlight passes through the translucent surface and is concentrated in a focal line or a focal point in or before reaching the interior space.

Advantageously, the translucent surface can include a Fresnel lens, a holographic lens or a refractive optical element. These optical elements can be used to concentrate the direct radiation on the energy conduit and allow passage of diffuse radiation.

The systems according to the invention can be arranged in the focal line or the focal point, where the concentrated light is converted either into heat (thermal solar collector) or into an electric current (photovoltaic collector). Alternatively or in addition, collimated light can be deflected and channeled by secondary optical elements into the interior space located behind the light element. The energy conduit can also include solar cells, which may require active or passive means to remove excess heat from the solar cell.

Alternatively, the energy conduit can be implemented as a fluid line. The hereby absorbed heat can subsequently be supplied to a useful thermodynamic or thermal system.

According to another feature of the present invention, the energy conduit can include a light guide. The light guide is adapted to transport the concentrated light and/or further concentrate the light from several light guides.

According to another feature of the present invention, the entry end of the light guide tracks the movement of the focal plane, whereas the exit end is stationary and aimed onto the energy conduit.

To protect the light element from wind, weather and contamination, the light element can be located behind a translucent protective surface. The protective surface can be a single glass pane which can be easily cleaned, making it unnecessary to regularly clean the special optics of the light element located behind the glass pane. The light element can also be located between two translucent surfaces forming dual panes which provide optimal protection for the light element.

In general, the energy conduit can be placed between the translucent surface and an additional translucent surface. The additional translucent surface can be in the form of a protective surface or can be designed to also direct only that portion of the radiation onto the energy conduit that directly strikes the surface.

According to another feature of the present invention, the translucent surface(s) may demarcate a living space. Advantageously, only the diffuse portion of the radiation can be detected in the living space, since the portion of the radiation which directly strikes the surface is aimed onto the energy conduit and is hence absorbed before reaching the living space.

BRIEF DESCRIPTION OF THE DRAWING

Other features and advantages of the present invention will be more readily apparent upon reading the following description of preferred exemplified embodiments of the invention with reference to the accompanying drawing, in which.

DETAILED DESCRIPTION OF PREFERRED EMBODIMENTS

Figure 1:
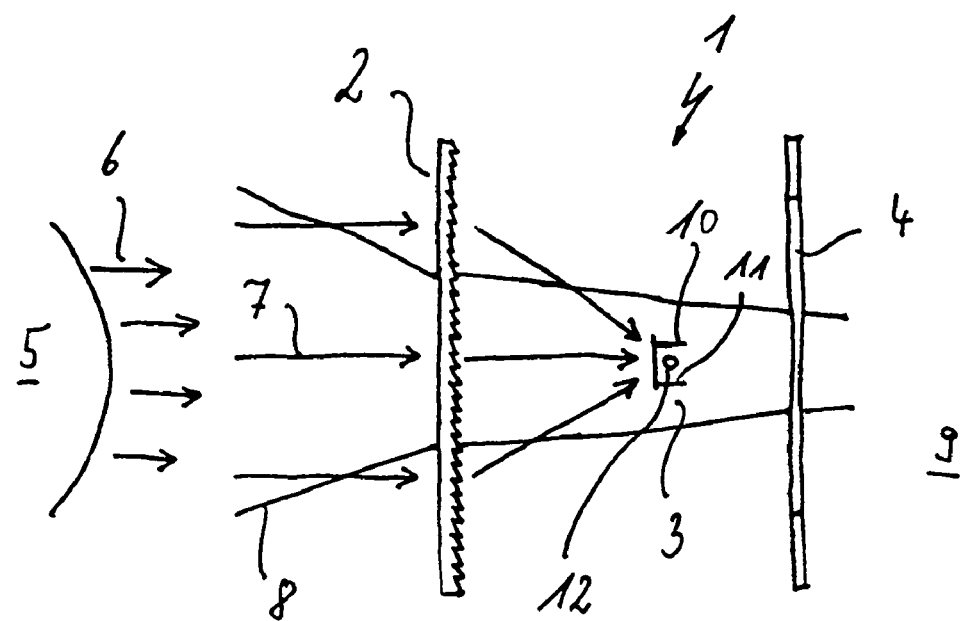
FIG. 1 shows schematically a first embodiment of a light element system according to the invention with a photovoltaic module.

Turning now to the drawing, and in particular to FIG. 1, there is shown schematically a first embodiment of a light element according to the invention, generally designated by reference numeral 1 and including a translucent surface 2 and an energy conduit 3. The energy conduit 3 in the illustrated exemplified embodiment is implemented as a photovoltaic element and located between the translucent surface 2 which is here a Fresnel lens, and a window pane 4.

The radiation 6 originating from the sun 5 strikes the translucent surface 2 partially as direct radiation 7 and partially as diffuse radiation 8. The Fresnel lens concentrates the direct radiation 7 on the photovoltaic collector 3, whereas the diffuse radiation 8 passes through the Fresnel lens and the window pane 4 located behind the Fresnel lens.

The Fresnel lens 2 can form a point image or a linear image, thereby concentrating the radiation onto a point-shaped or linear energy conduit 3. Moreover, the Fresnel lens 2 can rotate about one or two axes to track the sun 5. In this way, a large portion of the direct radiation can be concentrated on a focal line or a focal point where the energy conduit 3 is located that converts the radiation energy into electrical energy. The diffuse portion of the radiation 8 of the sun 5 passes through the lens, bypassing the energy converter, and reaches an interior space 9 which is to be illuminated and is located behind the window pane 4.

With the arrangement of the invention, a sufficient amount of non-glaring light passes into the interior space 9, while the energy contained in the direct portion of the radiation 7, which is not transmitted into the interior space 9, is utilized effectively.

The photovoltaic module 3 may be in the form of a strip or a circle and is cooled since it is operated under concentrated illumination. Suitably, an active cooling loop (for example water) can be employed, so that the entire system supplies not only light, but also electric power and low temperature thermal energy (the cooling water typically has a temperature of 40° C.–50° C.). Silicon is a suitable material for concentrator-type solar cells operating with linear optical elements, whereas gallium-arsenide is a superior material for solar cells using optic elements that focus to a point.

FIG. 1 shows cooling fins 10, 11 instead of a water cooling, and the photovoltaic module 3 can be rotated about the axis 12 to track the sun 5.

Figure 2:
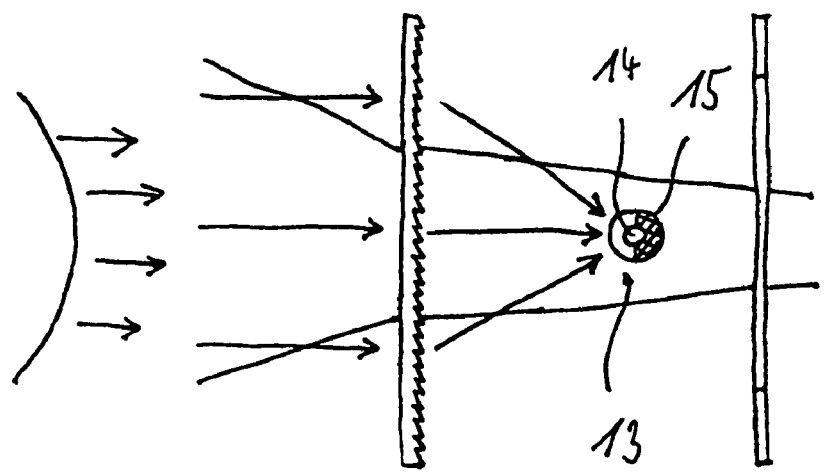
FIG. 2 shows schematically a second embodiment of a light element system according to the invention with a fluid line.

FIG. 2 shows a similar system, wherein the photovoltaic module is replaced by a fluid line 13 which allows additional removal of thermal energy. The fluid line 13 is implemented as a hollow absorber tube which is blackened on the outside (if a linearly focusing optics is used) or an absorbing sphere which is blackened on the outside (if optics focusing to a point is used). Fluid 14 to be heated, which can be a gas or a liquid, circulates inside the tube or the sphere. The rotation axis of the corresponding linear (one-dimensional) focusing optics coincides with the center axis of the absorbing tube 13, whereas the focal point of optics that focuses in two dimensions is located in the center of the absorbing sphere.

The thermal efficiency of the absorber 13 can be enhanced by surrounding the absorber 13 with a transparent jacket tube or enveloping sphere 15. The space between the jacket 15 and the absorber can be evacuated and the absorber surface can be blackened. In this way, the absorption of the concentrated light flux is maximized, while at the same time the heat reflection of the absorber is minimized.

The thermal energy collected in the absorber can be used, for example, to heat, to supply service water, or to cool (with sorption systems, Sterling refrigeration systems, etc.) the building equipped with the system of the invention. However, other thermodynamic machines (e.g., steam turbines or Stirling Engines) can also be operated. Systems using linear optical elements typically operate at temperatures between approximately 50° C. and 400° C., whereas systems using two-dimensional focusing optics can operate at temperatures significantly above 1000° C.

Figure 3:
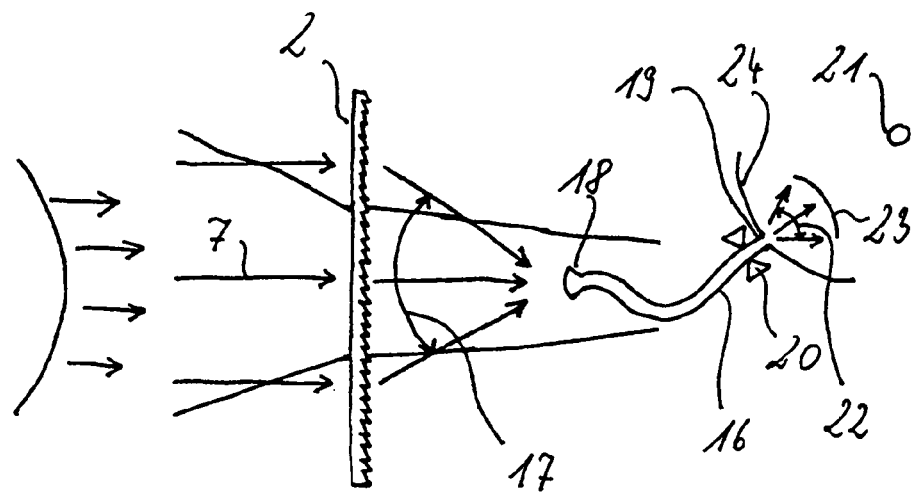
FIG. 3 shows schematically a third embodiment of a light element system according to the invention with a light guide.

FIG. 3 shows a system with a flexible light guide 16. The light guide 16 is in the form of a concentrated parallel light bundle and is used to guide the light 7 that is concentrated in a focal line or in the focal point, deep into the building. Suitable systems formed of mirrors and/or lenses can be employed to collimate the light rays converging towards the focal line or the focal point, so that the light can be redirected from the focal line or focal point region to a desired remote location without excessive divergence. Because the optics tracking the sun causes continuous changes in the angle of incidence at the focal line or focal point, the orientation of the additional collimating optics that redirects the optical beam has to be controlled so that the target is continuously illuminated in accordance with the optical conditions. In the present exemplified embodiment, this problem is solved by a flexible light guide in the shape of a strip (for a linearly focusing optics) or a circular light guide (for focusing optics focusing in two dimensions). The collimated direct radiation 7 is diffracted by the Fresnel lens 2 to form a converging ray bundle with an angle 17. The flexible light guide 16 collects the rays from a solid angle which is greater than or equal to the angle 17, and guides the rays inside the light guide 16 through total internal reflection.

As a consequence of the flexibility of the light guide 16, the entry end 18 for the light can be so connected to the sun-tracking optics that the entry end can be permanently oriented perpendicular to the optic axis of the incident light rays, on the one hand, and the rotation axis and point of rotation, respectively, of the optical system extends through the entry end 18, on the other hand. In this way, the concentrated direct portion of the sunlight can be coupled into the flexible light guide regardless of the position of the sun.

A holder 20 positions the exit end 19 so as to always point in the direction of the target 21. A suitable optical arrangement collimates the light diverging at an angle 22 from the exit end 19 of the light guide to an extent that depends on the respective illumination requirements. This is attained in the present embodiment by combining two opposing concave mirrors 23, 24. However, systems which include only lenses in the exit light bundle are also feasible.

The afore-described systems demonstrate that optical systems which transmit the diffuse portion of the daylight and bundle the direct portion of the daylight in well-defined, spatially distinct focal zones, can be used to provide a pleasant non-glare interior illumination of buildings. At the same time, these systems can also provide heating, cooling and electrical power and illuminate more distant zones in the building. In the described embodiments, Fresnel lenses are used to lower weight and cost. However, the systems can also employ holographic lenses and/or refractive optical elements.

The lens system can be housed in front of or behind an existing window, a glass wall or a glass roof of a building. If the systems are located behind a window pane, i.e., inside the building, then the unwanted heat load that originates from the radiation receivers and the radiation converters located on the focal lines or focal points, can be reduced to a minimum through appropriate thermal insulation and by diverting the fluid flow to the outside.

Typically, lens system installed behind windows, transparent facades or transparent roofs are more advantageous because they can fulfill their optical function without being impacted by wind or rain. This simplifies the required sun tracking system, because materials, gears and mechanical components that are arranged in a protective environment behind windows, can be significantly less expensive and lighter, conserve energy and have a longer service life.

Figure 4:
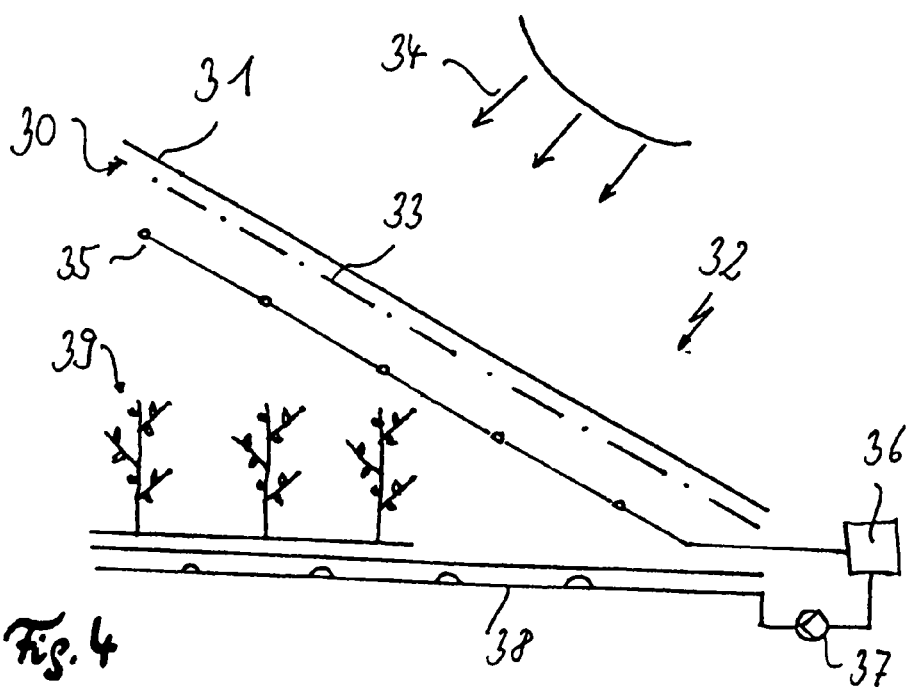
FIG. 4 shows schematically a system according to the invention employed for a greenhouse.

FIG. 4 depicts an exemplary installation of a light element 30 according to the invention behind a translucent protective surface 31. The translucent protective surface 31 is here formed by an outer glass wall of a greenhouse 32. Arranged below the protective surface 31 are lenses 33 indicated as a dash-dotted line. The lenses 33 concentrate the direct portion of the received solar radiation 24 onto pipes 35. Fluid flows through the pipes 35 and is collected in a heat reservoir 36. For example, at night, heated fluid can be withdrawn from the heat reservoir 36 and pumped through a piping system 38 by pump 37 to heat the greenhouse 32. Plants 39 located in the greenhouse 32 essentially only receive the diffuse portion of the light passing through the lenses and—optionally—also a portion of the direct light that passes through those roof areas that are not covered by lenses. The portion of the light that passes between the lenses can also be converted to diffuse light by placing a highly transmissive, preferably light textile fabric in these areas. The light fabric efficiently converts direct light into diffuse light through forward scattering.

Figure 5:
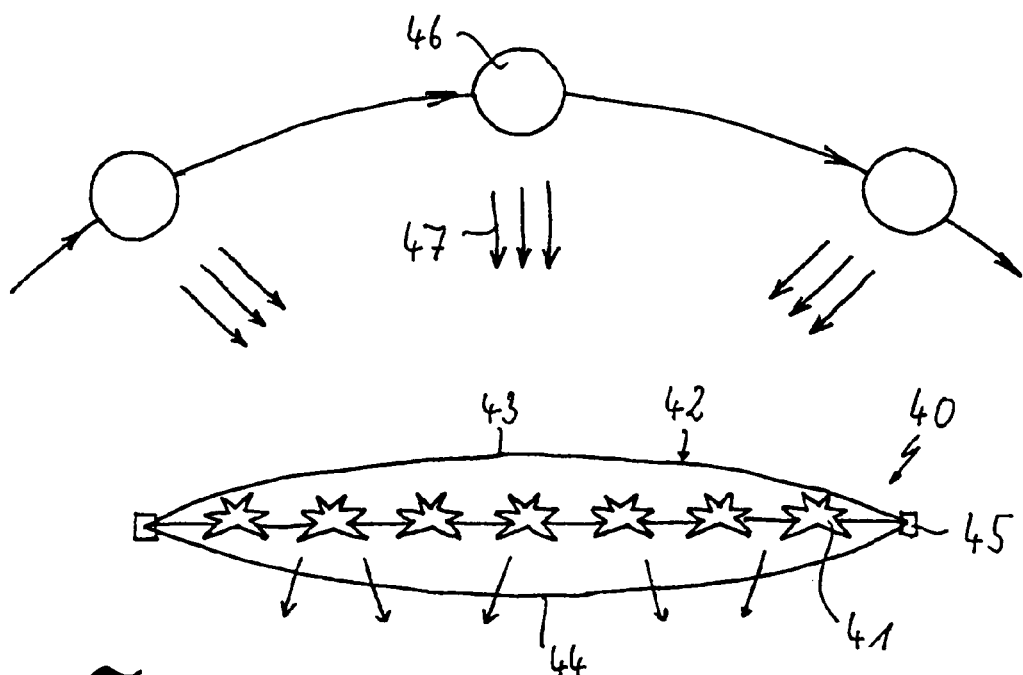
FIG. 5 shows schematically a climatic pillow.

FIG. 5 illustrates a modular optical element 40 in the form of a pillow 42. The transparent pillow 42 is inflated, for example with compressed air, with the optical lens system 41 and the light collection and conversion systems according to the invention arranged in the pillow 42. The pillow 42 can be made, for example, of two highly transparent, mechanically robust and environmentally stable fluoropolymer sheets 43 and 44 shaped into a pillow by an internal air overpressure and supported along their circumference by a mechanically stable profile 45, such as a frame. The rotation axes and the fluid lines of the lens system 41 also extend through this profile. The profile 45 allows the pillow 42 to easily track the sun 46, so that the direct radiation 47 strikes the upper pillow cover 43 substantially normal to its surface.

Figure 6:
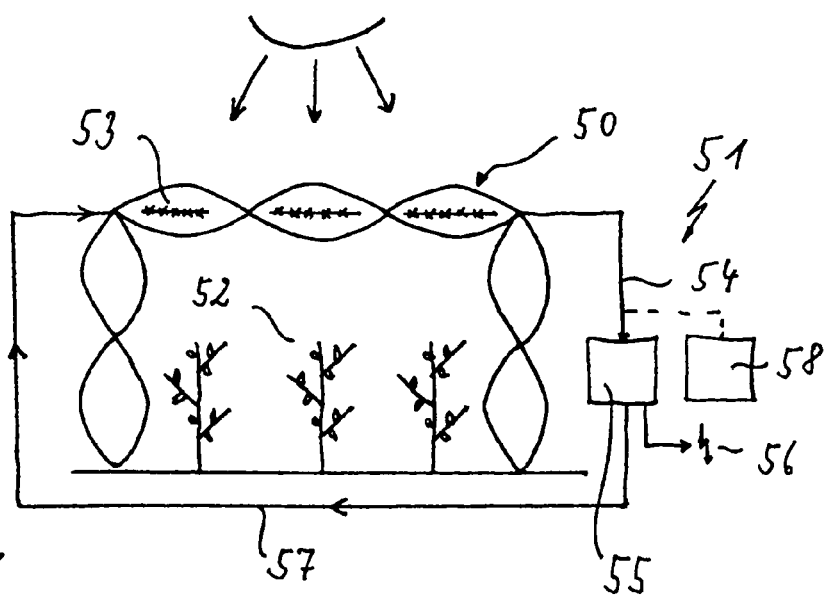
FIG. 6 shows schematically a climatic pillow employed with a greenhouse.

FIG. 6 shows an exemplary envelope of a greenhouse 51 formed of several inflated pillow elements 50 that may be supported by frame elements 45. Plants 52 located inside the greenhouse 51 thereby receive sufficient light and remain at a suitable temperature. The lens system 53 produces a hot fluid which is supplied to a thermodynamic machine 55 through a line 54. Electric power 56 can be produced, and the cooled fluid is returned to the lens system 53 through a second line 57. Optionally, a heat reservoir 58 can be connected between the lens system 53 and the thermodynamic machine 55 for providing around-the-clock power, for example, during periods of a bad weather.

Greenhouses are particularly suited for semi-arid and arid climate zones. The conditioned inside climate enables optimal plant growth. The energy produced in the envelope can be used to supply the energy to such expandable modular "oases."

Entirely new types of solar power plants for generating and distributing electric power can also be constructed. The floor space required for the power plant is not wasted, but rather automatically enhanced, since, as described above, the floor space can also provide optimal living and working conditions for plants and humans.

Figure 7:
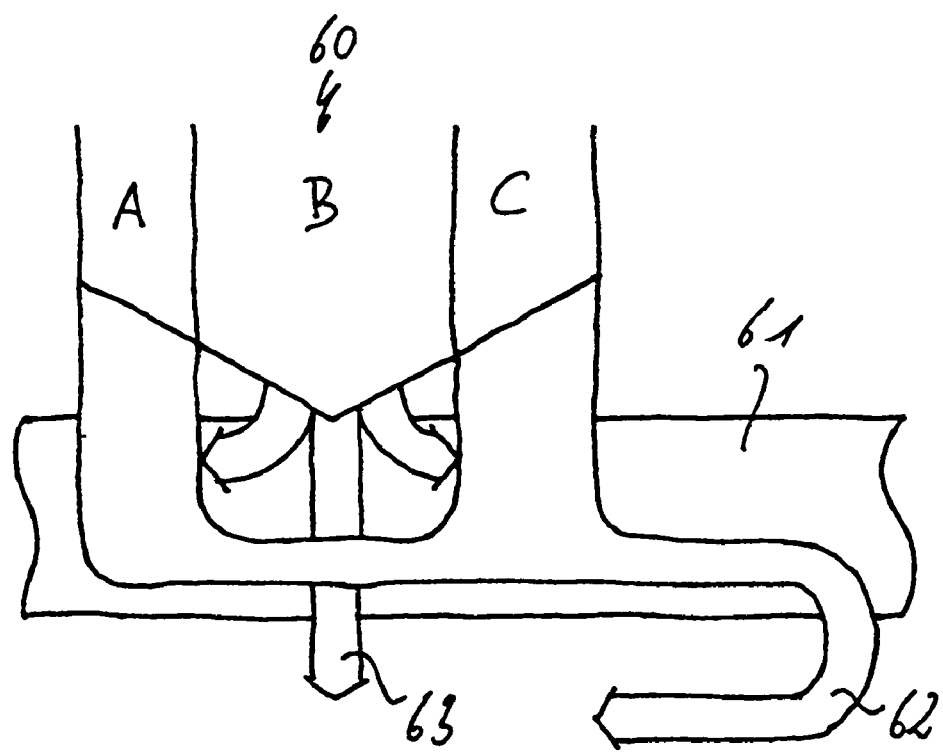
FIG. 7 shows schematically the energy flux around in climatic pillow.

FIG. 7 schematically illustrates the energy flux entering and leaving the energy and climate envelope. The incident solar radiation 60 consists of spectral ranges A, B, C, with A representing the short-wave invisible UV portion of the spectrum, B the visible spectrum, and C the long-wave invisible infrared portion of the spectrum. The lens system and energy conduit inside the climate and energy cover 61 convert the global radiation into heat, cooling, electrical power as well as directed concentrated light 62. The various aforementioned types of energy can be produced either exclusively or in combination with other types of energy.

The diffuse portion 63 of the incident global radiation is not focused by the lens system and hence reaches the space 64 behind or below the energy climate cover in form of diffuse, non-glare light.

The system of the invention represents a versatile solar building block and can be used as a window, facade element or roof element in conventional buildings as well as for the construction of complete building covers in various forms. The interior space of such buildings is climate controlled with respect to heat and light, with the cover producing additional energy.

While the invention has been illustrated and described as embodied in a light element with a translucent surface, it is not intended to be limited to the details shown since various modifications and structural changes may be made without departing in any way from the spirit of the present invention.

What is claimed as new and desired to be protected by Letters Patent is set forth in the appended claims:

1. A greenhouse, comprising:
    a plurality of frame elements forming a frame of the greenhouse,
    a plurality of pillows having at least one upper translucent surface facing a radiation source, each pillow supported in a respective frame element,
    a fluid element having a fluid circulating therethrough and a lens system arranged inside each pillow and formed so as to direct and concentrate only the direct incident radiation that strikes the upper translucent surface onto the fluid element, and
    a thermodynamic machine extracting thermal energy from the fluid for producing at least electrical power.

2. The greenhouse of claim 1, and further comprising a heat reservoir for storing a portion of the thermal energy that is not extracted by the thermodynamic machine.

3. The greenhouse of claim 1, wherein the light collection and conversion system includes a solar cell or a photovoltaic collector; and wherein the translucent surfaces are each an element selected from the group consisting of a Fresnel lens, a holographic lens and a refractive optical element.

4. The greenhouse of claim 3, wherein each of the pillows is made from environmentally stable fluoropolymer sheets.

5. The greenhouse of claim 1, wherein the lens system is a suntracking lens system.

6. A modular greenhouse comprising:
- a plurality of modular optical elements, each optical element including first and second highly transparent cover sheets supported by a mechanically stable frame thereby forming a pillow, with a plurality of pillows forming an envelope for the greenhouse,
- an optical lens system arranged inside each pillow which directs and concentrates direct incident radiation that strikes the translucent cover sheets of each pillow, and
- a light collection and converting system arranged integrated in each said modular optical element for collecting light and converting light into energy.

7. The greenhouse of claim 6, wherein the pillows are inflated.

8. The greenhouse of claim 7, wherein the optical lens system inside each pillow, or the pillow itself is adapted for tracking a movement of the sun so that direct incident radiation from the sun can strike a surface of an upper pillow cover sheet, and wherein the lens system in each of the pillows is oriented in such a way as to realize a concentration of direct incident radiation into a focal area of the light collection and converting system.

9. The greenhouse of claim 8, wherein hot fluid is produced through solar radiation by the lens system and supplied to a thermodynamic machine, via a first line while cooled fluid is returned to the lens system via a second line.

10. The greenhouse of claim 9, wherein a heat reservoir is connected between the lens system and the thermodynamic machine for providing around the clock power.

11. The greenhouse of claim 8, wherein a solar cell is located in the focal area of the light collection and converting system.

12. The greenhouse of claim 6, wherein the light collection and conversion system includes a solar cell or a photovoltaic collector.

13. The greenhouse of claim 6, further comprising that diffuse radiation is transmitted through the optical lens system creating a glare free illumination for plant growing or illumination of rooms.

* * * * *